United States Patent [19]

Barzach

[11] Patent Number: 5,034,741

[45] Date of Patent: Jul. 23, 1991

[54] VARIABLE LENGTH BIT PATTERNS FOR DATA REPRESENTATIO

[75] Inventor: Eugene I. Barzach, Glastonbury, Conn.

[73] Assignee: United Technologies Corporation, Hartford, Conn.

[21] Appl. No.: 497,271

[22] Filed: Mar. 22, 1990

[51] Int. Cl.$^5$ .............................................. H03M 7/40
[52] U.S. Cl. ........................................ 341/67; 341/65; 341/106; 341/107; 341/51
[58] Field of Search ....................... 341/50, 51, 52, 55, 341/59, 60, 61, 64, 65, 67, 68, 63, 90, 106, 107; 370/48, 49; 375/25, 117; 371/57.1

[56] References Cited

U.S. PATENT DOCUMENTS

| | | | |
|---|---|---|---|
| 3,016,527 | 1/1962 | Gilbert et al. | 340/347 |
| 3,051,940 | 8/1962 | Fleckenstein | 340/347 |
| 3,675,211 | 7/1972 | Raviv | 340/172.5 |
| 3,675,212 | 7/1972 | Raviv et al. | 340/172.5 |
| 3,689,899 | 9/1972 | Framarzek | 340/172.5 |
| 3,701,111 | 10/1972 | Cocke et al. | 340/172.5 |
| 3,716,851 | 2/1973 | Neumann | 340/347 |
| 3,717,851 | 2/1973 | Cocke et al. | 340/172.5 |
| 4,247,891 | 1/1981 | Flynn et al. | 341/63 X |
| 4,358,852 | 11/1982 | Ichikawa et al. | 341/63 X |
| 4,396,906 | 8/1983 | Weaver | 341/65 |
| 4,463,344 | 7/1984 | Adler et al. | 341/51 |
| 4,597,057 | 6/1986 | Snow | 364/900 |
| 4,598,326 | 7/1986 | Leiner | 360/40 |
| 4,618,846 | 10/1986 | Ross et al. | 340/347 |
| 4,675,652 | 6/1987 | Machado | 341/67 X |
| 4,882,583 | 11/1989 | Dimitri et al. | 341/59 |
| 4,899,149 | 2/1990 | Kahan | 341/107 X |

FOREIGN PATENT DOCUMENTS 0069943 4/1985 Japan ..................................... 341/63

Primary Examiner—Benjamin R. Fuller
Assistant Examiner—Randy W. Gibson
Attorney, Agent, or Firm—Donald W. Muirhead

[57] ABSTRACT

Representational efficiency is realized by employing a set (6) of variable length bit patterns (7-14) having a first and last bit equal to a particular binary value and havin only singularly occurring bits equal to said value. The patterns (7-14) can be unambiguously concatenated to form a data stream (15). A communication system (16) can achieve improved throughout by employing said patterns (16).

10 Claims, 1 Drawing Sheet

VARIABLE LENGTH BIT PATTERNS FOR DATA REPRESENTATIO

DESCRIPTION

1. Technical Field

This invention relates to the field of electronic communications and more particularly to the field of electronic communications employing variable length binary bit patterns for data representation.

2. Background Art

Information can be represented by a series of binary values (i.e. 1's and 0's) which are grouped together to form bit patterns. Many bit patterns can be combined into a set and mapped one for one to the information which is being represented. For example, the ASCII bit pattern set contains bit patterns for representing letters, numbers, and symbols wherein each unique pattern represents a unique letter, number, or symbol.

The simplest type of bit pattern set has every bit pattern in the set with a fixed number of bits. However, where each unique bit pattern is used to represent unique data elements and where the probability of occurrence of a particular data element differs from the probability of occurrence of another particular data element, an increase in data representational efficiency (i.e. an increase in the ratio of the information represented to the number of bits) can be achieved by employing variable length bit patterns and by mapping the patterns with the greater number of bits to the data elements with the lower probability of occurrence. For example, if a variable length bit pattern set were employed to encode letters of the alphabet used to form English text, the letter 'E', which occurs most frequently, would be mapped to a pattern having the least number of bits while the letter 'Z', which occurs least frequently, would be mapped to a pattern having the greatest number of bits.

One difficulty associated with employing variable length bit pattern sets is that shorter patterns which occur adjacently within a serial bit stream (serial bit streams are used extensively for communication between computers and between computers and peripherals) may be combined to form patterns identical to other, longer patterns. For example, if the bit pattern '11' were used to represent the letter 'E', the bit pattern '00' were used to represent the letter 'A', and the bit pattern '1100' were used to represent the letter 'S', then the bit stream '1100' is ambiguous because the stream could represent either the letters 'EA' or the letter 'S'.

This difficulty can be avoided by employing a set of variable bit patterns which contain no patterns that can be formed by the concatenation of any other combination of patterns within the set. For example, U.S. Pat. No. 3,689,899, entitled "Run-Length-Limited Variable-Length Coding with Error Propagation Limitation" (Franaszek) avoids ambiguity by employing a complicated scheme to attach unique bit sequences to the end of each bit pattern in order to be able to unambiguously distinguish between separate patterns.

Similarly, the Huffman code uses bit patterns which end with a single zero or are the maximum pattern length and which contain ones in all of the remaining bit positions. There is no ambiguity because the patterns can be distinguished by the ending zero or by having the maximum number of bits which are all ones. For example, a four element set of Huffman codes would be comprised of the following bit patterns: 0, 10, 110, and 111.

While the '899 patent, the Huffman code, and other variable length schemes solve the problem of concatenation ambiguities, the solutions employed cause the number of bits in subsequent patterns within the set of bit patterns to increase substantially as the number of patterns in the set is increased. For example, the longest bit pattern within a set of N Huffman code bit patterns has $N-1$ bits. The increase in the number of bits runs counter to the purpose of using variable length bit patterns, i.e. decreasing the total number of bits employed to represent data in order to increase data representational efficiency.

DISCLOSURE OF INVENTION

Objects of the invention include construction and use of a set of variable length bit patterns wherein no pattern within the set can be formed by concatenating one or more other patterns of the set and wherein the number of bits contained in the longest pattern is minimized as the number of patterns within the set is increased. According to the present invention, a set of bit patterns for representing data contains variable length bit patterns having a first and last bit equal to a particular binary value and having only singularly occurring bits equal to said binary value.

The foregoing and other objects, features and advantages of the present invention will become more apparent in light of the following detailed description of exemplary embodiments thereof, as illustrated in the accompanying drawings.

BRIEF DESCRIPTION OF THE DRAWINGS

FIG. 2 is a sample bit stream formed by using the bit patterns of FIG. 1.

BEST MODE FOR CARRYING OUT THE INVENTION

Figures 1, 3:
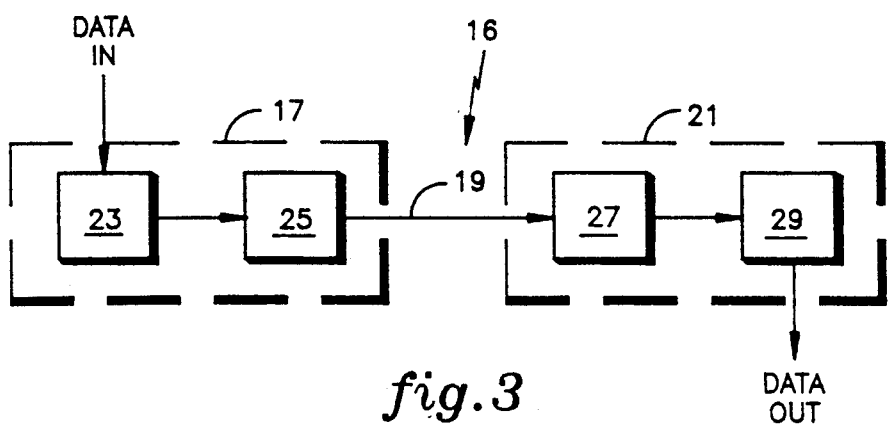
FIG. 1 is a table of bit patterns according to the invention.
FIG. 3 is a block diagram of a communications system which employs the invention.

Referring to FIG. 1, a table 6 illustrates a set of variable length bit patterns 7-14. Each of the patterns 7-14 has a most significant (left-hand most) bit equal to zero and a least significant (right-hand most) bit equal to zero.

Also, each of the patterns 7-14 has only singularly occurring bits equal to zero (i.e. no bit equal to zero is adjacent to another bit equal to zero). Note that there are an infinite number of bit patterns which start and end with a zero bit and which have only singularly occurring zero bits. Therefore, the patterns 7-14 shown in the table 6 are a subset of the infinite number of such patterns which exist. The patterns 7-14 in FIG. 1 can be mapped to some of the letters of the alphabet. The pattern 7 can be mapped to the letter 'A' The pattern 8 can be mapped to the letter 'B'. The pattern 9 can be mapped to the letter 'C'. The pattern 10 can be mapped to the letter 'D'. Because the number of bits the patterns 7-10 varies, this mapping would increase data representational efficiency (i.e. increase the ratio of information per number of bits) if the frequency of occurrence of the letter 'A' is greater than that of 'B' which is greater than that of 'C' which is greater than that of 'D'.

FIG. 2 illustrates that the above mapping can be employed to construct a bit stream 15. The stream 15, which represents the letters 'ABCD', has two consecutive zero bits wherever, and only wherever, two separate patterns are joined. This consecutive zero bit phenomena occurs even if the pattern 7, which contains only one zero bit, were placed between two other patterns. For example, the stream which represents the letter sequence 'CAB' would be 01100010. The three consecutive zero bits in the third through fifth bit positions within the stream can be thought of as a pair of consecutive zero bits wherein the forth bit of the stream is common to each pair. Although the stream 15 contains variable length bit patterns, note that it is possible to store the stream 15 in a data memory having N bit long fixed length data partitions by dividing the stream 15 into a plurality of N bit fixed length patterns and storing each fixed length pattern in each memory partition.

Referring to FIG. 3, a communications system 16 is comprised of a transmitter 17, a transmission channel 19, and a receiver 21. Data is input from an external data source (not shown) into the transmitter 17 (by a variety of means known to those skilled in the art) and is relayed via the communication channel 19 to the receiver 21. The data is extracted from the receiver 21 by an external data sink (not shown) by a variety of means known to those skilled in the art. The transmission channel 19 can be a single electrical wire, a plurality of electrical wires, a telephone line, or any other digital signal conducting medium known to those skilled in the art.

The transmitter 17 is comprised of a first data mapper 23 and a signal driver 25. The data mapper 23 translates input bit patterns into variable length bit patterns having most and least significant bits equal to zero and having only singularly occurring zero bits and then concatenates said variable length bit patterns into a single stream of bits. The data mapper 23 uses a microprocessor system having a ROM (Read only Memory) lookup table (not shown), in a manner known to those skilled in the art, in order to convert input bit patterns into a stream containing said variable length bit patterns. The input bit patterns may be of any data format such as ASCII. There is, however, a unique variable length bit patterns for each unique input bit patterns The bit stream is output from the data mapper 23 into the signal driver 25. The signal driver 25 converts the bits of the stream into a format which is appropriate for the particular medium used for the communication channel 19. For example, if the communication channel 19 is a telephone line, the signal driver 25 would output a first or a second tone for each bit of the stream wherein the first tone would represent a bit equal to zero and the second tone would represent a bit equal to one. If the communication line 19 is a fiber optic cable, the signal driver 25 would output pulses of light.

The receiver 21 is comprised of a signal buffer 27 and a second data mapper 29. The signal buffer 27 converts the bit stream signal received via the communication channel 19 into a format suitable for input to the second data mapper 29. For example, if the channel 19 is a fiberoptic link and the second data mapper 29 is a digital device, then the signal buffer would convert light signals to digital electrical signals.

The second data mapper 29 divides the bit stream into separate variable length bit patterns (wherever two consecutive zero bits exist) and then converts each of the variable length bit patterns into an output data format such as ASCII. The second data mapper 29 uses a microprocessor system having a ROM lookup table (not shown), in a manner known to those skilled in the art.

The communication system 16 achieves efficient data throughput (i.e. a high information to number of bits ratio) when data which occurs more frequently corresponds to variable length bit patterns, as described above, having the fewest number of bits. As the cost of using the communication channel 19 increases, the efficiency achieved by the communication system become more advantageous.

Even though the invention has been illustrated with bit patterns having a zero in the most and least significant bit positions and having only singularly occurring zero bits, the invention can be practical with patterns having a one bit in the most and least significant bit positions and having only singularly occurring one bits.

The communications system 16 is not restricted as to the type of signals relayed between the transmitter 17 and the receiver 21 via the communication channel 19. Although the data mappers 23, 29 are shown as microprocessor based systems having ROM lookup tables, the mappers 23, 29 can be implemented a variety of ways, as known to those skilled in the art, which require neither microprocessors nor ROM lookup tables. Even though the data into and out of the communication system 16 is shown as ASCII, the system 16 can be used to transmit any type of data.

Although the invention has been shown and described with respect to exemplary embodiments thereof, it should be understood by those skilled in the art that various changes, omissions and additions may be made therein and thereto, without departing from the spirit and the scope of the invention.

I claim:

1. In a method of using a set of bit patterns to represent a set of data elements, a step of mapping each unique one of said data elements into a unique one of said bit patterns wherein each of said patterns has a first and last bit equal to a particular binary value and wherein each of said patterns has only singularly occurring bits equal to said binary value.

2. A method, according to claim 1, where said particular binary value is zero.

3. A method, according to claim 1, where said particular binary value is one.

4. A method, according to claim 2, wherein the most frequently occurring elements within said set of data elements are mapped to bit patterns having the least number of bits.

5. A method, according to claim 3, wherein the most frequently occurring elements within said set of data elements are mapped to bit patterns having the least number of bits.

6. A communication system, comprising:
   a first data mapper for translating input data into a set of bit patterns having a first and a last bit equal to a particular binary value and having only singularly occurring bits equal to said value and for concatenating said bit patterns into a bit stream;
   a transmitter, for transmitting said bit stream;
   a receiver, for receiving said bit stream; and
   a second data mapper for dividing said stream into a plurality of variable length bit patterns and for translating said patterns into output data.

7. A communication system, according to claim 6, wherein said particular binary value is zero.

8. A communication system, according to claim 6, wherein said particular binary value is one.

9. A communication system, according to claim 7, wherein said input data is in the ASCII format 10. A communication system, according to claim 8, wherein said output data is in the ASCII format.

10. A communication system, according to claim 8, wherein said output data is in the ASCII format.

* * * * *

UNITED STATES PATENT AND TRADEMARK OFFICE
CERTIFICATE OF CORRECTION

PATENT NO. :  5,034,741
DATED      :  July 23, 1991
INVENTOR(S) :  Eugene Barzach It is certified that error appears in the above-identified patent and that said Letters Patent is hereby corrected as shown below:

On the title page and Col. 1, lines 1-2, cancel "representatio" and insert

--Representation--.

Column 4, line 63, after "format" insert --.--

Column 4, line 63, after "format" cancel "10.A".

Column 4, lines 64 and 65, delete in their entirety.

Signed and Sealed this

Twenty-second Day of December, 1992

Attest:

DOUGLAS B. COMER

*Attesting Officer*     Acting Commissioner of Patents and Trademarks